United States Patent [19]
Gasworth

[11] Patent Number: 6,010,756
[45] Date of Patent: Jan. 4, 2000

[54] RUGATE FILTER AND METHOD OF MAKING SAME

[75] Inventor: Steven M. Gasworth, Scotia, N.Y.

[73] Assignee: Lockheed Martin Corporation, Palmdale, Calif.

[21] Appl. No.: 09/080,934

[22] Filed: May 19, 1998

[51] Int. Cl.[7] .................................................. C23C 16/34
[52] U.S. Cl. .......................... 427/576; 427/579; 427/162; 427/166; 427/255.31; 427/255.394; 427/255.7
[58] Field of Search .................... 427/576, 579, 427/162, 166, 255.31, 255.394, 255.7

[56] References Cited

U.S. PATENT DOCUMENTS

| | | | |
|---|---|---|---|
| 3,792,916 | 2/1974 | Sarna | 350/163 |
| 3,853,783 | 12/1974 | Tucker | 252/300 |
| 5,238,738 | 8/1993 | Miller | 428/333 |
| 5,258,872 | 11/1993 | Johnson | 359/589 |
| 5,293,548 | 3/1994 | Siebert | 359/580 |
| 5,475,531 | 12/1995 | Rahmiow | 359/586 |
| 5,523,882 | 6/1996 | Rahmiow | 359/580 |

OTHER PUBLICATIONS

Sainty et al., Applied Optics, vol. 34, No.25, pp. 5659–5664, Sep. 1995.
Chemical Abstract No. 127:212624 of Yu et al., Gongneng Cailiao, 27(6) pp. 530–533, (no month) 1996.
Lim et al., Thin Solid Films, vol. 236, Nos. 1–2, pp. 64–66, Dec. 1993.
Lim et al., Thin Solid Films, vol. 245, Nos. 1–2, pp. 141–145, Jun. 1994.
Lim et al., Thin Solid Films, vol. 277, Nos. 1–2, pp. 144–146, May 1996.
Rugate Filter Sidelobe Suppression Using Quintic and Rugated Quintic Matcing Layers, by W. H. Southwell, et al, Applied Optics, vol. 28, No. 14 (Jul. 15, 1989).
Using Apodization Fuctions to Reduce Sidelobes in Rugate Filters byW. H. Southwell, Applied Optics, vol. 28, No. 23 (Dec. 1, 1989).

Primary Examiner—Timothy Meeks
Attorney, Agent, or Firm—Robert A. Schruhl

[57] ABSTRACT

The invention is a method of depositing a rugate filter coating on a substrate, with the coating having an index of refraction that varies with the depth thereof. In detail, the method comprising the steps of: a) placing the substrate in an apparatus capable of depositing the coating by a plasma-enhanced chemical vapor deposition process, the apparatus having the capacity to deposit a coating from a mixture of at least two gases and means to control the mixture of gases as a function of time; b) calculating the required refractive index profile wherein the index of refraction is a function of depth thereof using the filter parameters; c) calculating the required total depth of the coating; d) dividing the total depth of the filter into a series of increments having a specific length; e) calculating the index of refraction for each of the series of increments; f) calculating the specific mixture of the at least two gases required to provide the index of refraction for each of the series of increments and the length of time required to deposit the required thickness of each increment; and g) depositing the coating on the substrate by providing the specific mixture of the at least two gases for the specific time such that the series of increments of the coating is deposited on the substrate. The nugate filter consists of a transparent coating on a substrate having an incrementally varying refractive index profile along its width, with the width of the increment between 5 and 30 angstroms.

10 Claims, 6 Drawing Sheets

INDEX OF REFRACTION

PHYSICAL THICKNESS

OPTIONS FOR MULTIPLE BAND RUGATE FILTERS: COMPARISON OF DESIGNS

| | DISCRETE SECTIONS | SUPERPOSITION WITH REDUCED $\Delta N$ | SUPERPOSITION WITH CLIPPING * |
|---|---|---|---|
| OD @ 633 NM | 6 | 10.8 | 10.7 |
| OD @ 830 NM | 6 | 7.8 | 8.2 |
| OD @ 1064 NM | 6 | 6 | 6.1 |
| $\Delta\lambda$ @ 633 | 49 | 16 | 29 |
| $\Delta\lambda$ @ 830 NM | 64 | 20 | 39 |
| $\Delta\lambda$ @ 1064 NM | 81 | 26 | 50 |
| $\Delta N$ EACH BAND | 0.25 | 0.08 | 0.25 |
| TOTAL THICKNESS ($\mu$) | 49.1 | 65.7 | 34.3 |

\* RESULTS WERE OBTAINED BY SIMULATION

FIG. 11

RUGATE FILTER AND METHOD OF MAKING SAME

BACKGROUND OF THE INVENTION

1. Field of the Invention

The invention relates to the field of rugate filters for reflecting selective electromagnetic frequencies and, in particular, to a method of making a multi-wavelength reflecting filter in the form of a coating on a translucent plastic or glass substrate.

2. Description of Related Art

It is well known in the field of optics that when light impinges upon any interface where there is a change in the index of refraction from one material to another, air to glass for example, some of the incident light will be reflected. In addition, at the interface where the light traverses from a material of relatively high index of refraction to one having a lower index of refraction, a phase change of 180 degrees occurs in the reflected light. Thus by properly selecting layer thickness, destructive cancellation of the incident light at consecutive interfaces is achieved. Consequently, the more interfaces an incident light beam traverses, the greater the amount of the incident light is reflected. Thus if enough layers are incorporated substantially all the light of a particular wavelength can be filtered out before reaching the substrate.

Therefore, conventional optical filters usually consist of a series of discrete layers of material deposited on an optical substrate. The material of each layer is selected, such that there is a change in the index of refraction at each interface, so that the index of refraction alternates from a higher value to a lower value or visa versa at each layer interface. Thus as the number of layers increases, the greater the amount of incident light that is reflected. Examples of "stacked" layer filter designs can be found in U.S. Pat. No. 5,238,738 "Polymeric Minus Filter" by R. H. Miller and U.S. Pat. No. 3,792,916 "Anti-Laser Optical Filter Assembly" by D. S. Sama. U.S. Pat. No. 3,853,783 "Vanadyl Phthalocyanine Sulfonamides And Laser Protective Plastic Filters Containing The Same" by R. J. Tucker particularly discloses a coating formulation offering protection form lasers operating from 620 to 720 nanometer wavelengths. However, such multi-layer coatings when used to protect from lasers operating over a wide range of discrete frequencies, become very thick. In addition, the occurrence of discrete interfaces makes the coatings relatively susceptible to mechanical failure and laser damage. Furthermore, the fabrication process does not lend itself to the non-periodic structure called for by multiple bands at non-commensurate wavelengths.

A newer approach is to use rugate filters that consist of a single layer of material formed wherein the index of refraction varies throughout its thickness. Because such rugate filters are typically formed by a continuous deposition process, it is an easy matter to vary the mixture deposited on the substrate, and thus vary the index of refraction. Examples can be found in U.S. Pat. No. 5,258,872 "Optical Filter" by W. E. Johnson, et al. and disclosed in U.S. Pat. No. 5,475,531 "Broadband Rugate Filter" by T. D. Rahminow, et al. They have the ability to meet optical specifications while avoiding the abrupt material interfaces inherent in a stacked layer filter. The option to implement multiple rejection bands within a common coating structure also tends to minimize mechanical failure issues.

It is also known that a number of wavelengths can be suppressed by having the profile of the final rugate filter be the resultant profile of the sum of the individual profiles desired, which is discussed in U.S. Pat. No. 5,523,882 "Rugate Filter Having Suppressed Harmonics" by T. D. Rahmolow. This patent discloses a concept for suppressing both the principle wavelength and its harmonics by setting the index of refraction versus optical thickness profile that superimposes on the principle sinusoid for the rejection of a principle wavelength a secondary sinusoid having a index of refraction versus optical thickness profile with an amplitude of about 10 percent of the principle sinusoid, and a phase difference of about minus 90 degrees. U.S. Pat. No. 5,293,548 "Dispersive Rugate Coatings" by E. T. Siebert also discloses coatings having a spatially varying index of refraction profile through the depth thereof so as to provide a prescribed dispersion characteristic that matches a dispersion characteristic of a source of radiation signal. Thus rugate filters are well known in the art.

However, there are several problems in making such rugate filters, among the most important is that the prior art processes for making such filters typically depend upon processes that required expensive vacuum deposition techniques commonly called "sputtering." In the sputtering process it is difficult to accurately control the sputtering of two materials to precisely vary the index of refraction. Other processes such as laser flash evaporation, ion beam assisted deposition, resistive and electron-beam evaporation all do not lend themselves to large plastic or glass substrates and/or require relatively expensive equipment. The use of vapor deposition processes eliminates some of the difficulties encountered when sputtering. But providing a process that accurately varies the index of refraction so as to provide precise reflectance bands, while providing maximum light transmittance therethrough, without requiring expensive equipment and/or process control procedures has not been heretofore available.

Thus, it is a primary object of the invention to provide a process for making a rugate filter having multiple reflectance bands.

It is another primary object of the invention to provide a process for making a rugate filter having multiple reflectance bands and improved transmittance without requiring expensive equipment.

It is a further object of the invention to provide a process for making a rugate filter with an index of refraction profile that simulates a continuously varying refractive index by depositing discrete micro-layers.

SUMMARY OF THE INVENTION

The invention is a rugate filter and a method of depositing a rugate filter coating on a substrate, with the coating having an index of refraction that varies with the depth thereof. In detail, the method comprises the steps of:

a) Placing the substrate in an apparatus capable of depositing the coating by a plasma enhanced chemical vapor deposition process, the apparatus having the capacity to deposit a coating from a mixture of at least two gases and means to control the mixture of gases as a function of time. The preferred gases are Ammonia gas ($NH_3$) and Nitrous Oxide gas ($NO_2$), the mixture of which is varied, in the presence of Silane gas ($SiH_4$) and Argon, the amount within the chamber being held constant. The resulting coating is a combination of Silicon, oxygen and nitrogen in specific ratios providing the variation in the index of refraction. Silicon Dioxide ($SiO_2$) provides an index of refraction of about 1.5 while Silicon Nitride ($Si_3N_4$) provides a value of about 2.0.

The plasma-enhanced chemical vapor deposition apparatus includes a vacuum chamber wherein the substrate is mounted therein. A RF generator is coupled via an impedance matching network to a lower electrode positioned below the substrate. An upper electrode is positioned at the top of the chamber above the substrate. Thus when the power is on and the chamber is at a reduced pressure, a plasma is generated within the chamber. Typically, a water heating system is used to heat the chamber walls and electrodes to proper operating temperatures. Flow control valves are coupled to a gas manifold, for adjusting the flow of process gases to the chamber and are controlled by a computer. An exhaust port is coupled to the chamber which includes a throttle valve for controlling gas flow to a blower and pump. The drawing of a vacuum on the chamber insures that the mixture of gases therewithin is maintained at the desired pressure.

b) Calculating the required continuous refractive index profile for rejecting at least one electromagnetic radiation wave length wherein the index of refraction is a function of depth thereof using selected coating parameters.

c) Calculating the required total depth of the coating.

d) Dividing the total depth of the continuous coating into a series of increments having a specific thickness, the thickness preferably held between 5 and 30 angstroms.

e) Calculating the index of refraction for each of the series of increments.

f) Calculating the specific mixture of the at least two gases required to provide the index of refraction for each of the series of segments and the length of time required to deposit the required thickness of each segment.

g) Depositing the coating on the substrate by providing the specific mixture of the at least two gases for the specific time such that series of segments of the coating are deposited on the substrate.

It is also possible to use this method make a rugate filter having multiple reflectance bands by depositing two or more single band filters in succession. The advantages are identical. In fact, in some instances, the filter thickness is reduced over the single multi-band coating.

Having described the method of making the rugate filter it can be seen that the filter itself can be defined as one comprising a transparent coating on a substrate, the coating having an incrementally varying refractive index profile along its width, with the width of the increment between 5 and 30 angstroms. Additionally, the incremental refractive index profile can be apodized in the sinusoidal portion as well having the end portions matched to the extent possible by the materials used to make the rugate filter, to the index of refraction of the material in contact at the ends thereof. For example, with a coating on a window, the window material and air. In addition, if there are two or more electromagnetic radiation wavelength bands to be reflected, the rugate filter can comprise a series of segments equal to the number of bands to be reflected, with each segment configured to reflect one of the bands.

The novel features which are believed to be characteristic of the invention, both as to its organization and method of operation, together with further objects and advantages thereof, will be better understood from the following description in connection with the accompanying drawings in which the presently preferred embodiment of the invention is illustrated by way of example. It is to be expressly understood, however, that the drawings are for purposes of illustration and description only and are not intended as a definition of the limits of the invention.

DESCRIPTION OF THE PREFERRED EMBODIMENT

Figure 1A:
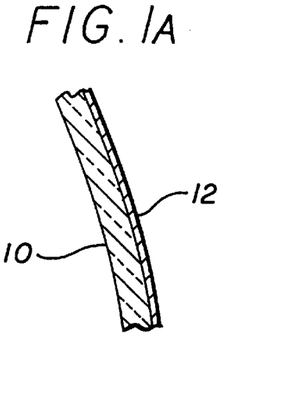
FIG. 1A is a partial cross-section view of a window (substrate) having a rugate filter coating thereon.
Figure 1B:
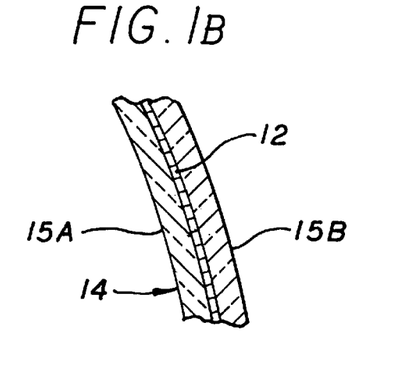
FIG. 1B is a partial cross-section view of a double panel window having a rugate filter coating therebetween.

Illustrated in FIG. 1A is a partial cross-sectional view of window or substrate 10 having a rugate filter coating 12 thereon. The window 10 can be made of translucent plastic or glass material. The coating is a combination of Silicon, Oxygen and Nitrogen in specific ratios providing the variation in the index of refraction. For example, as previously mentioned, Silicon Dioxide ($SiO_2$) provides an index of refraction of about 1.5 while Silicon Nitride ($Si_3N_4$) provides a value of about 2.0. These materials are deposited by means of a plasma-enhanced chemical vapor deposition process (PECVD) varying the flow rate of Ammonia gas ($NH_3$) and Nitrous Oxide gas ($NO_2$) in the presence of a mixture of Silane gas ($SiH_4$) and Argon, although there are numerous other combination of materials that can be used. The details of the process will be subsequently discussed. In FIG. 1B is a second partial cross-sectional view of a window 14 made up of two translucent plastic or glass panels 15A and 15B having a rugate filter coating 12 sandwiched therebetween. There are numerous other combinations of substrate/rugate coating combinations; however, regardless of combination, the subject process can be used to deposit the rugate filter on a substrate.

Figure 2A:
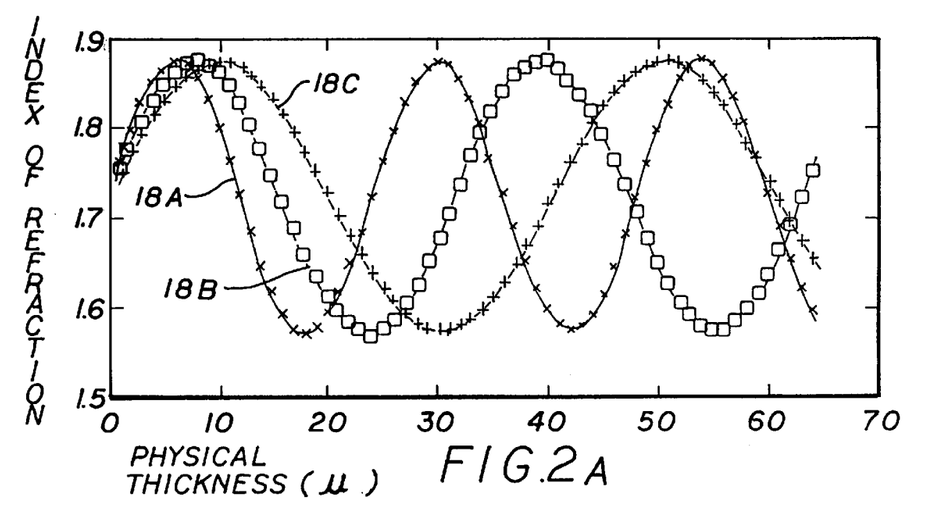
FIG. 2A is a graph of index of refraction profile for three separate filters for three wavelengths.
Figure 2B:
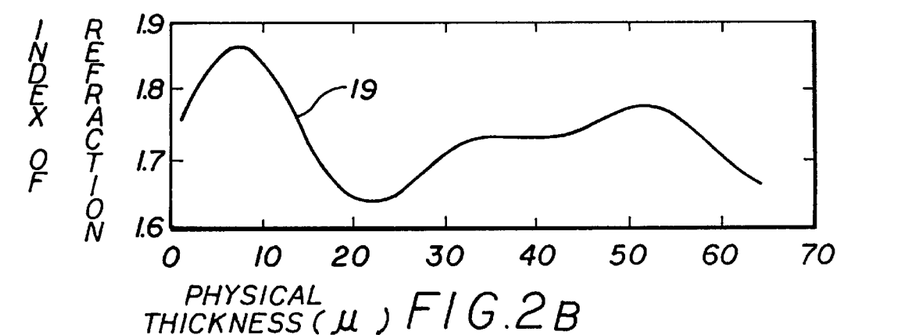
FIG. 2B is a graph of the combined index of refraction profile for the combined wavelengths shown in FIG. 2A.
Figure 3:
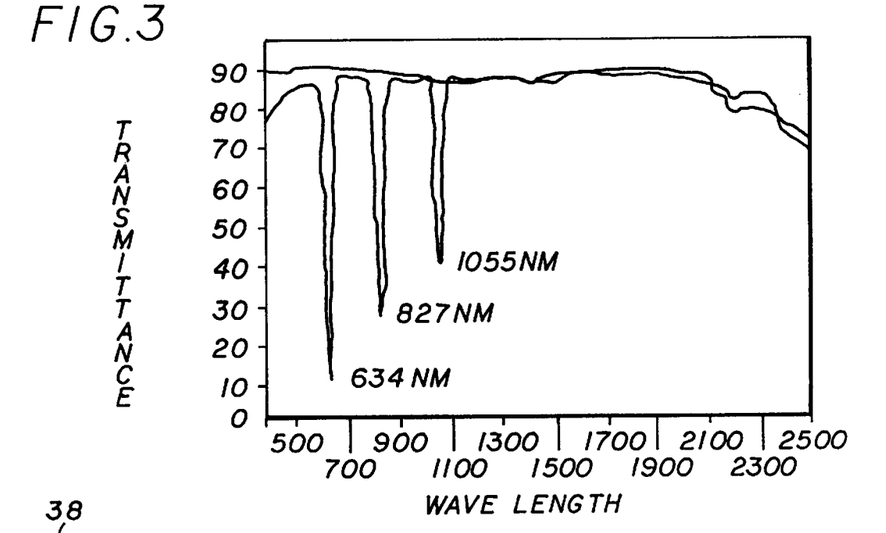
FIG. 3 is a is graph the transmittance versus wave length for the rugate filter designed to filter out three separate wavelengths.

In FIG. 2A is a graph of three separate of the sinusoidal index of refraction pattern versus thickness for the reflection of three electromagnetic radiation wavelengths, 634 nm, 827 nm, and 1055 nm that would be required to achieve reflection thereof, indicated by numerals 18A, 18B, and 18C, respectively. Of course, the number of cycles will be dependent upon the amount of total incoming radiation that must be reflected. However, when one attempts to combine the three wavelengths, the curve becomes more complicated as illustrated in FIG. 2B, which is the combined index of refraction required when transmission of all three bands are to be suppressed by means of a single rugate filter. The resulting effect of the combination is illustrated in FIG. 3, which is a graph of transmittance versus electromagnetic radiation wavelength typically achieved by a filter made by the subject process.

Figure 4:
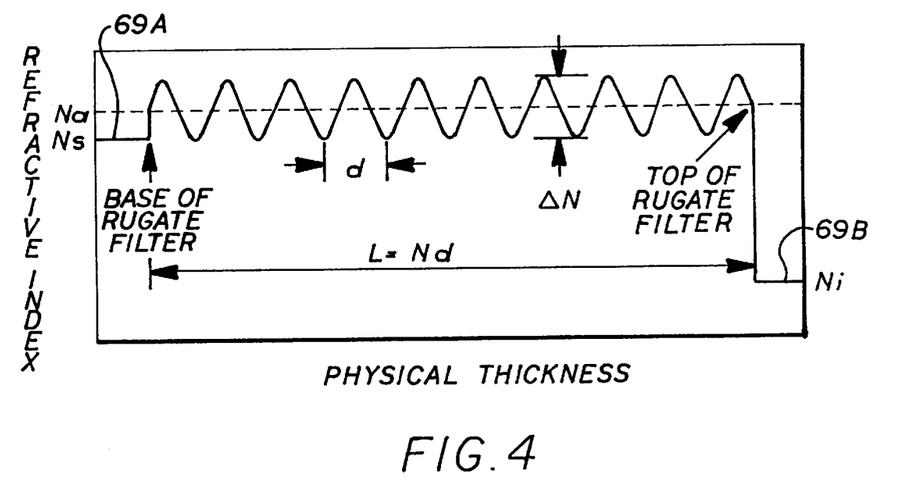
FIG. 4 is a graph illustrating the various parameters in the equation for calculating the index of refraction profile for a single band rugate filter.
Figure 5:
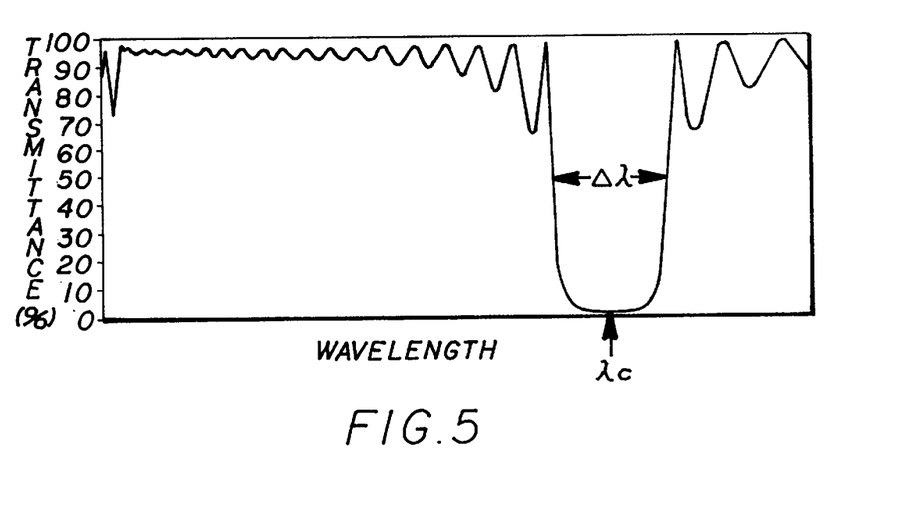
FIG. 5 is a graph illustrating the normal-incidence transmittance spectrum for the single band rugate filter illustrated in FIG. 4.

Referring to FIGS. 4 and 5, the equation for the required index of refraction through such a filter is determined by the following well established equations.

The equation for center wavelength $\lambda_c$ is:

$$\lambda_c = 2n_a d$$

The equation for refractive index profile n(x) is:

$$n(x) = n_a + \Sigma_{bands}(\Delta n/2)\sin(2\pi x/d + \theta)$$

The bandwidth $\Delta\lambda$ is given by the equation:

$$\Delta\lambda = \Delta nd = (\Delta n/n_a)(\lambda_c/2)$$

The optical density OD is given by the equation:

$$OD = 0.68N\Delta n/n_a - \log(4n_i/n_s)$$

The equation for filter thickness (Nd) is:

$$Nd = \lambda_c^2/(2.8\Delta\lambda n_a) [OD + \log(4n_i/n_s]$$

The reflectance (R) is given by the equation:

$$R = 1 - T = 1 - 10^{-OD}$$

Where:
$n_a$=average refractive index
d=physical thickness of one sinusoidal period
$\Delta n$=the peak-to-peak refractive index
X=the depth from the surface of the rugate filter
$\theta$=the phase at the substrate
N=the number of sinusoidal periods
$n_i$=the refractive index of incident medium
$n_s$=the refractive index of the substrate
T=the transmittance Once the refractive index profile n(x) has been calculated, it is a simple matter to form the rugate filter on the substrate, by means of the apparatus, generally indicated by numeral 20 illustrated in FIG. 6 and by use of the process flow chart in FIG. 7.

Figure 6:
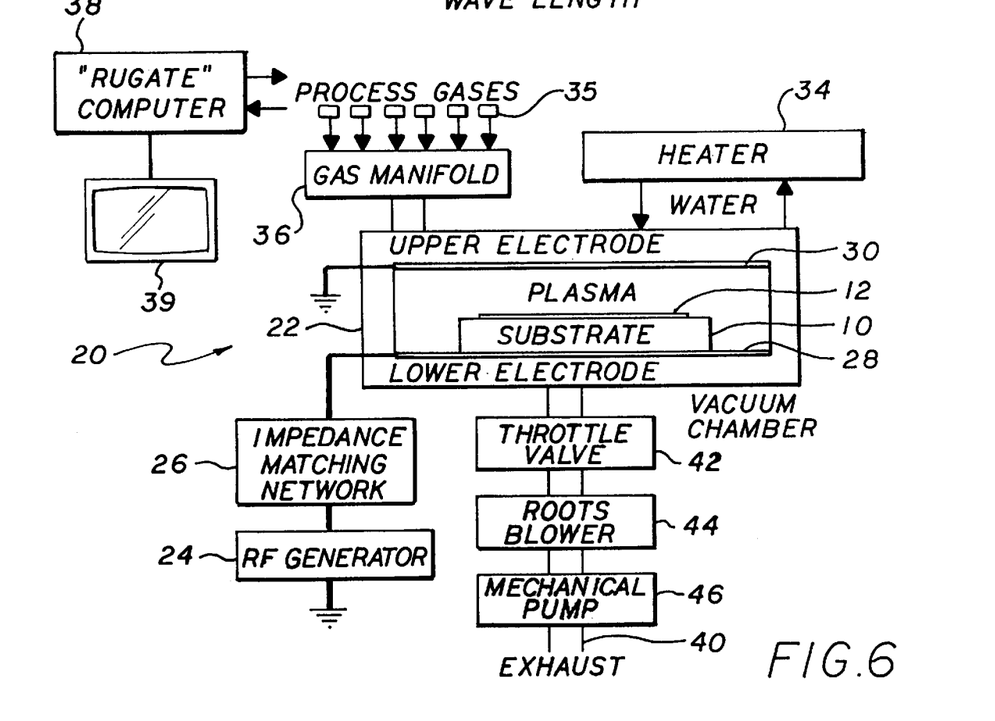
FIG. 6 is a schematic representation of the plasma-enhanced chemical vapor deposition apparatus used to make the rugate filter coating.

Referring particularly to FIG. 6, the plasma-enhanced chemical vapor deposition apparatus 20 comprises a vacuum chamber 22 where in the substrate 10 is mounted therein with the nmgate filter coating 12 thereon. A RF generator 24 coupled to an impedance matching network 26 is connected to a lower electrode 28 positioned below the substrate 10. An upper electrode 30 is at the top of the chamber 22 above the substrate 10. Thus when the power is on and the chamber 22 is at reduced pressure, a plasma is generated within the chamber 22. A water heating system 34 is used to heat the chamber 22 walls and electrodes 28 and 30. Gas flow control valves 35 for controlling the flow of process gases, are connected to the chamber 22 via gas manifold 36 and are controlled by the computer 38, having a monitor 39. An exhaust port 40 is coupled to the chamber 22 which includes a throttle valve 42 which controls gas flow to a blower 44 and a pump 46. Thus it can be seen that the plasma-enhanced chemical vapor deposition process is generally conventional.

Figure 7:
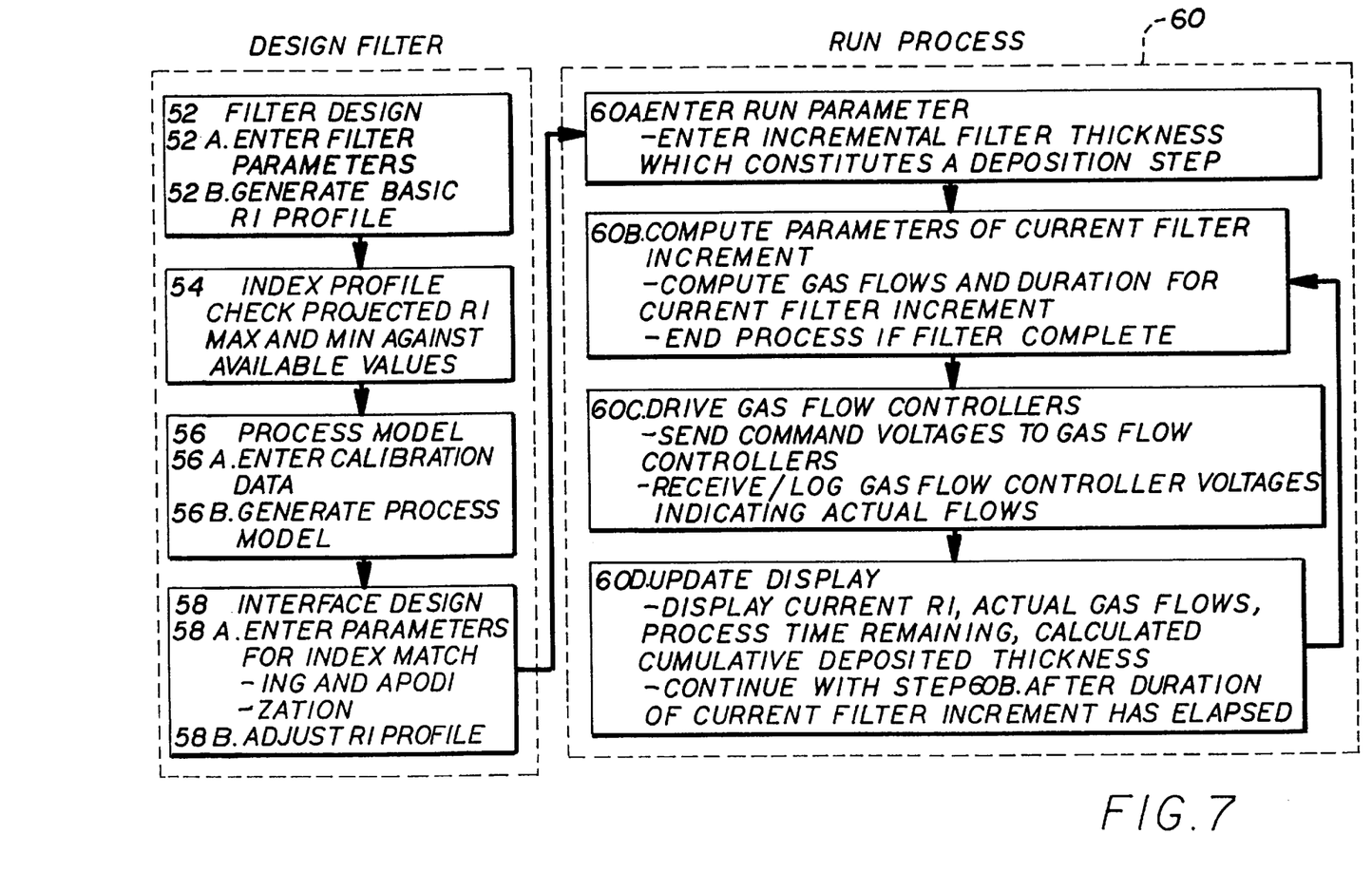
FIG. 7 is a flow chart of the process used for making the rugate filter coating using the apparatus illustrated in FIG. 6.

Still referring to FIG. 6 and additionally to FIG. 7, the first main step 52 is the design of the filter coating, which involves a first sub-step 52A, of entering the filter coating parameters into the computer 38:

average RI desired for filter RI profile;
RI of incident medium (for example, air) and filter substrate;
number of stop bands
wavelengths and bandwidths for each stop band
number of sinusoidal periods for any one band.

Figure 8:
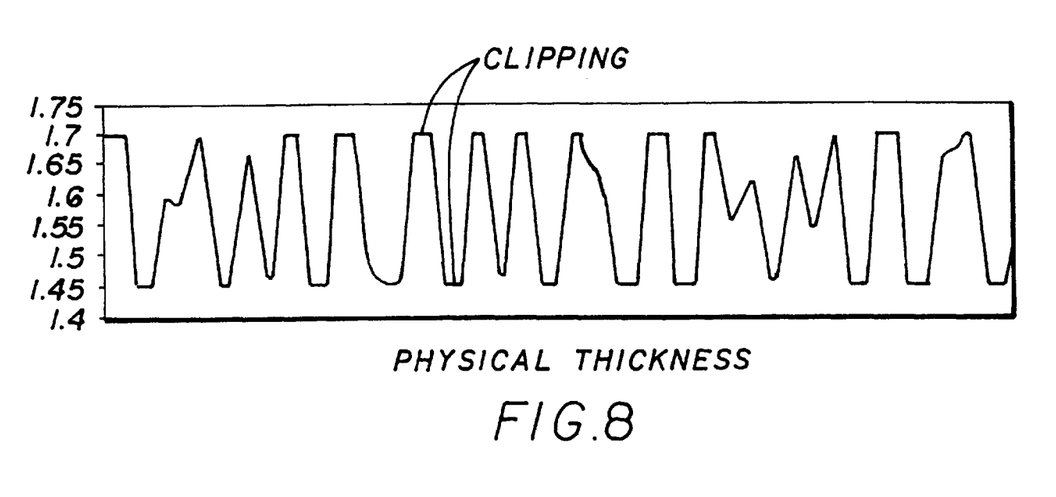
FIG. 8 is a graph illustrating the effect of clipping the reflectance index profile.

Thereafter the computer 38 in sub-step 52B generates the basic RI profile by combining these inputs with the rugate design equations to determine RI as function of depth in coating n(x). In the second main step 54, the computer monitor 39 displays the RI profile and indicates maximum and minimum RI projected for the coating design. Note that the computer operator may adjust the filter design, if the maximum and minimum RI can not be realized with the process gases on hand by reducing the peak-to-peak refractive index ($\Delta n$). Another approach is to clip the peaks as illustrated in FIG. 8.

Figure 9:
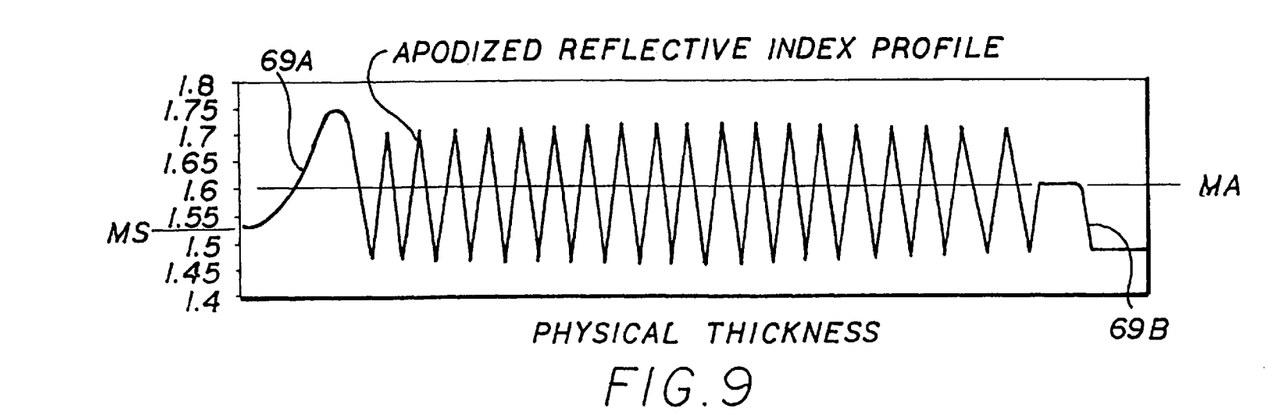
FIG. 9 is a graph illustrating the effect of apodization of an refractive index profile.

The third main step 56 is to determine a model for the process. Here the operator enters the previously measured deposition rates and RIs for the two sets of flow rates of the nitrous oxide and ammonia corresponding to the maximum and minimum realizable RIs. Note that the Silane gas/Argon mixture is kept constant in this process. The computer 38 thereafter generates analytical expressions for the deposition rate and RI as functions of nitrous oxide and ammonia flow rates. The fourth main step 58 is the interface design wherein the index matching and apodization parameters are entered, and the RI profile is appropriately adjusted. Apodization refers the technique of providing amplitude modulation of the sinusoidal portion of the refractive index profile which results in the gradual tapering of the amplitude of the sinusoidal profile at both ends of the profile. An example of apodization of a RI profile is illustrated in FIG. 9.

RI apodization and index matching techniques are old in the art and are discussed in the following published articles: "Rugate Filter Sidelobe Suppression Using Quintic and Rugated Quintic Matching Layers" by W. H. Southwall and R. L. Hall, Applied Optics, Vol. 28. No. 14, Jul. 15, 1989, and "Using Apolization Functions To Reduce Sidelobes In Rugate Filters" by W. H. Southwall, Applied Optics, Vol. 25. No. 23, December 1989. Such techniques suppress side lobes which detract from the transmission in the filter. The operator may select between quintic and rugated quintic index matching, and enters thickness of index matching layers. The operator then selects between quintic, gaussian and linear apodization and enters the percent of filter thickness to be apodized. The computer 38 then automatically adjusts the basic RI profile by adding amplitude modulation for apodization and leading and trailing index matching layers in FIG. 9, indicated by numerals 69A and 69B respectively.

Referring back to FIGS. 6 and 7, the fifth main step 60 is the actual step of depositing the coating on the substrate and involves a sub-step 60A wherein the operator enters the thickness of the filter increments into the computer 38, the series of which simulate the continuous RI profile resulting from the sub-step 58B. Typically, the increment is set between 5 and 30 angstroms, which allows very good matching with the continuous theoretical curve. It also eliminates, or, at least, alleviates the need for expensive and sophisticated control valves 36 that would be required for continuous modulation of gas flow, and makes overall processing control much easier to achieve.

Figure 10:
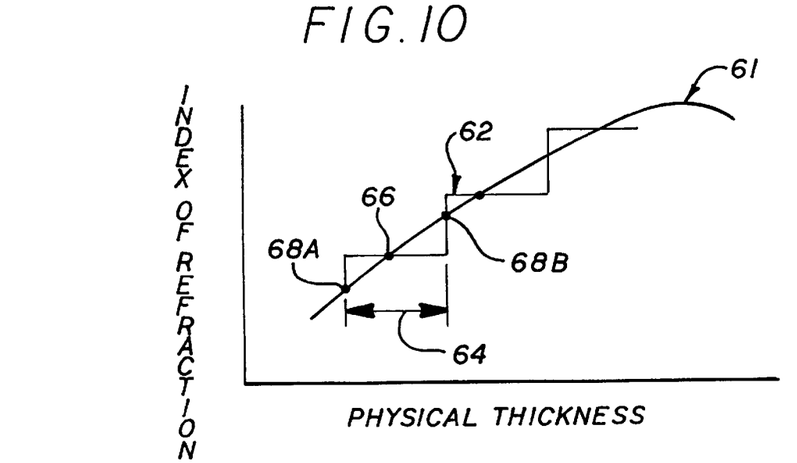
FIG. 10 is graph of a portion of a calculated refractive index profile with the incremented profile superimposed thereon.

FIG. 10 presents a graphical representation of the incrementing of the theoretical refractive index profile. The calculated continuous index of refraction curve 61 is divided into a series of increments 62 having a width 64 between 5 and 30 angstroms. The center point 66 of the increments 62 is the average of the end points 68A and 68B of the increments 62. Referring back to FIGS. 6 and 7, in sub-step 60B, the computer 38 uses the RI profile and analytical expressions from sub-step 56B to determine gas flows and duration of filter increment and ends process when the filter is complete. In sub-step 60C, the computer 38 sends drive signals to the control valves 36 for nitrous oxide and ammonia flows and checks Silane/Argon gas flow. The control valve position is also monitored. In the final sub-step 60D, the process time remaining and cumulative deposited thickness are calculated. Thereafter, the computer 38 returns to sub-step 60B and the sub-steps 60B to 60D are repeated until the total number of increments of the rugate filter 12 is deposited on the substrate 10.

The process, although an open loop process, using the increment deposition approach, is able to provide very good single layer multiple-band rugate filter coatings in a cost-effective manner, using relatively less expensive equipment. It can also be used to deposit a single band rugate filter or a multiple number of single band filters on top of each other to achieve multi-band reflection.

Figure 11:
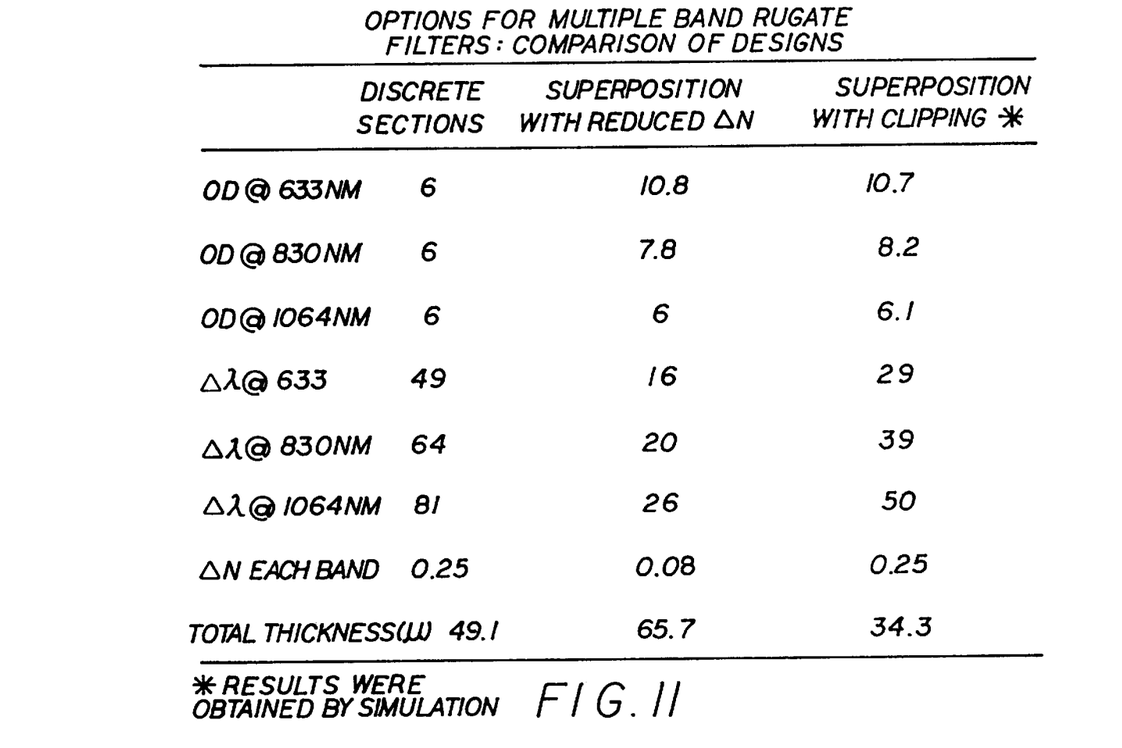
FIG. 11 is a chart comparing multi-band rugate filters using discrete sections, superposition and reduced peak-to-peak refractive index ($\Delta n$), and superpostion with clipping

Thus it can be that the rugate filter itself can be defined as a filter comprising a transparent coating on a substrate, the coating having an incrementally varying refractive index profile along its width, with the width of the increment between 5 and 30 angstroms. Additionally, the incremental refractive index profile can be apodized in the sinusoidal portion as well having the end portions matched to the extent possible by the materials used to make the rugate filter, to the index of refraction of the material in contact at the ends thereof. For example, with a coating on a window, the window material and air. In FIG. 11 is a chart comparing a multi-band rugate filter in discrete sections (3 separate single band rugate filters deposited one on top of each other), a superposition with reduced peak-to-peak refractive index (Δn), and superposition with clipping.

While the invention has been described with reference to a particular embodiment, it should be understood that the embodiment is merely illustrative as there are numerous variations and modifications which may be made by those skilled in the art. Thus, the invention is to be construed as being limited only by the spirit and scope of the appended claims.

INDUSTRIAL APPLICABILITY

The invention has applicability to the window and optical instrument manufacturing industries.

I claim:

1. A method of depositing a rugate filter coating for reflecting at least a portion of at least one electromagnetic wavelength band on a substrate, the coating having an index of refraction that varies with the depth thereof, the method comprising the steps of:
    placing the substrate in an apparatus capable of depositing the coating by a plasma-enhanced chemical vapor deposition process, the apparatus capable of depositing a coating from a mixture of at least two gases, said apparatus having means to control the mixture ratio of said at least two gases as a function of time;
    calculating the required continuous refractive index profile of the coating necessary to reflect the at least a portion of the at least one electromagnetic wave length band;
    calculating the required depth of the coating necessary to reflect the at least a portion of the at least one electromagnetic wave length band;
    dividing the depth of the calculated continuous refractive index profile of the coating into a series of increments having a specific thickness;
    calculating the index of refraction for each of the series of increments by computing the average value of the continuously varying index of refraction over each of said increments;
    calculating a specific mixture of the at least two gases required to provide the index of refraction for each of the series of increments and the length of time required to deposit each increment; and
    depositing the coating on the substrate by the plasma-enhanced chemical vapor deposition process by providing the specific mixture ratio of the at least two gases to deposit each of the increments of the coating on the substrate until the entire coating is deposited.

2. The method as set forth in claim 1 wherein the thickness of the increments is generally between 5 and 30 angstroms.

3. The method as set forth in claim 2 including the step of apodizing the refractive index profile.

4. The method as set forth in claim 3 wherein the side of the coating opposite to that in contact with the substrate is in contact with an ambient atmosphere, the method comprising the step of matching the index of refraction of the end portion of the rugate filter coating in contact with the atmosphere as close as possible to the index of refraction of the atmosphere and matching the index of refraction of the end portion of the rugate filter coating in contact with the substrate as close as possible to the index of refraction of the substrate.

5. The method as set forth in claim 1, or 2, or 3, or 4, wherein in said step of depositing the coating on the substrate; said two gases are ammonia gas and nitrous Oxide gas in the presence of an additional mixture of silane and argon gases.

6. A method of depositing a rugate filter coating on a substrate for rejecting at least a portion of incident electromagnetic radiation in at least one electromagnetic wavelength band, the method comprising the steps of:
    calculating the required continuous refractive index profile of the coating necessary to reflect the at least a portion of the at least one electromagnetic wave length band;
    calculating the required depth of the coating necessary to reflect the at least a portion of the at least one electromagnetic wave length band;
    dividing the depth of the calculated continuous refractive index profile of the coating into a series of increments having a specific thickness;
    calculating an index of refraction for each of the series of increments by computing the average value of the continuously varying index of refraction over each of the increments; and
    depositing the increments on the substrate by a plasma-enhanced chemical vapor deposition process so that each increment possesses the computed average index of refraction and the specific thickness therefore until the required depth of the coating is achieved.

7. The method as set forth in claim 6 wherein the of step depositing the increments on the substrate by a plasma-enhanced chemical vapor deposition process includes the steps of:

calculating the specific mixture ratio of at least two gases required to deposit each of said increments of the rugate filter coating; and providing the specific mixture ratio of the at least two gases to deposit each of the said increments of the coating on the substrate.

8. The method as set forth in claim 7 wherein the thickness of the increments is generally between 5 and 30 angstroms.

9. The method as set forth in claim 8 wherein the side of the coating opposite to that in contact with the substrate is in contact with an ambient atmosphere, the method comprising the step of matching the index of refraction of the end portion of the rugate filter coatinig in contact with the atmosphere as close as possible to the index of refraction of the atmosphere and matching the index of refraction of the end portion of the rugate filter coating in contact with the substrate as close as possible to the index of refraction of the substrate.

10. The method as set forth in claim 7, or 8, or 9, wherein said at least two gases are ammonia gas and nitrous oxide gas in the presence of an additional mixture of silane and argon gases.

* * * * *